United States Patent [19]

Tanaka et al.

[11] Patent Number: 5,059,847

[45] Date of Patent: Oct. 22, 1991

[54] SURFACE ACOUSTIC WAVE DEVICE

[75] Inventors: Toshiharu Tanaka, Higashiosaka; Kenichi Shibata, Hirakata; Kousuke Takeuchi, Hirakata; Masakazu Sakata, Hirakata; Hiroshi Okano, Hirakata; Kazuhiko Kuroki, Uji, all of Japan

[73] Assignee: Sanyo Electric Co., Ltd., Osaka, Japan

[21] Appl. No.: 507,288

[22] Filed: Apr. 10, 1990

[30] Foreign Application Priority Data

Apr. 11, 1989 [JP] Japan ................................. 1-92307
Jun. 19, 1989 [JP] Japan ................................. 1-156240
Nov. 9, 1989 [JP] Japan ................................. 1-292008

[51] Int. Cl.$^5$ ........................................... H01L 41/08
[52] U.S. Cl. ............................................. 310/313 A
[58] Field of Search ................... 310/313 A; 333/150, 333/193

[56] References Cited

U.S. PATENT DOCUMENTS

| 4,447,754 | 5/1984 | Wagers ........................... 310/313 R |
| 4,449,107 | 5/1984 | Asai et al. ........................... 333/150 |
| 4,501,987 | 2/1985 | Mitsuyu et al. .................. 310/313 A |
| 4,511,816 | 4/1985 | Mikoshiba et al. ............. 310/313 A |
| 4,567,393 | 1/1986 | Asai et al. ........................ 310/313 A |
| 4,640,756 | 2/1987 | Wang et al. ..................... 204/192.18 |
| 4,868,444 | 9/1989 | Shibata et al. . |
| 4,879,487 | 11/1989 | Sugai et al. ....................... 310/313 A |

FOREIGN PATENT DOCUMENTS

| 0313025 | 4/1989 | European Pat. Off. . |
| 58-59616 | 4/1983 | Japan . |
| 58-59617 | 4/1983 | Japan . |
| 58-59618 | 4/1983 | Japan . |
| 0106514 | 4/1989 | Japan . |
| 0125012 | 5/1989 | Japan . |

OTHER PUBLICATIONS

Patent Abstracts of Japan, vol. 13, No. 371 (E-807), Aug. 17, 1989.
Patent Abstracts of Japan, vol. 7, No. 148 (E-184), Jun. 29, 1983.

*Primary Examiner*—Mark O. Budd
*Assistant Examiner*—Thomas M. Dougherty
*Attorney, Agent, or Firm*—Armstrong, Nikaido, Marmelstein, Kubovcik & Murray

[57] ABSTRACT

A surface acoustic wave device comprising a single crystal silicon substrate and a piezoelectric thin film of single crystal or C-axis-oriented polycrystalline aluminum nitride formed on the surface of the substrate. The C-axis of the piezoelectric thin film is set in a direction in which the projection vector of the C-axis on a plane containing the axis of propagation direction of a surface acoustic wave and a normal axis of the substrate makes an inclination angle $\theta$ of up to 60 degrees with the axis of propagation direction, whereby the device is given a coupling coefficient of at least 2% is given as maximum coupling coefficient of the device.

10 Claims, 4 Drawing Sheets

SURFACE ACOUSTIC WAVE DEVICE

FIELD OF THE INVENTION

The present invention relates to surface acoustic wave devices comprising a piezoelectric aluminum nitride thin film formed on a single crystal silicon substrate.

BACKGROUND OF THE INVENTION

Surface acoustic wave devices are small-sized and stable to temperature and to variations with time, can be given the desired filter characteristics by varying the configuration of comblike electrodes and therefore find wide application, for example, to IF filters for television receivers, IF filters for satellite broadcasing, RF converter osillators for VTRs, etc. It is desired that surface acoustic wave devices be as great as possible in effective electromechanical coupling coefficient $K^2$ which represents the efficiency of conversion of electrical energy to surface acoustic wave energy.

We have already proposed a surface acoustic wave device which comprises a piezoelectric aluminum nitride film having a relatively large thickness (for example, of 20 μm to 30 μm) and formed on a substrate and in which the direction of C-axis orientation of the piezoelectric film is inclined with respect to a normal to the film (U.S. Pat. No. 4,868,444). The proposed device can be given a higher coupling coefficient than formerly possible.

If the substrate for forming the piezoelectric film thereon is a single crystal silicon substrate, other circuit devices can also be formed on the same substrate, whereby an electronic circuit including the surface acoustic wave device can be fabricated in the form of a single chip, hence an advantage. Further when the piezoelectric aluminum nitride film formed is thin, it becomes possible to produce the surface acoustic wave device with an improved efficiency than those wherein the piezoelectric film is of the bulk type or has a large thickness.

However, in the case of surface acoustic wave devices comprising a single crystal silicon substrate and a piezoelectric thin film formed thereon and having a thickness, for example of about 1 to about several micrometers, the coupling coefficient is dependent not only on the crystal structure, thickness and like characteristics of the piezoelectric thin film but also on the crystal structure and the like of the substrate, so that full research has yet to be made on improvements in coupling coefficient. In Unexamined Japanese Patent Publications SHO 58-59616, SHO 58-59617 and SHO 58-59618, for example, investigations were directed merely to the optimization of the thickness of piezoelectric aluminum nitride thin film, with the C-axis of the thin film set parallel or perpendicular to the single crystal silicon substrate. In this case, the coupling coefficient $K^2$ was up to 1.03% even under optimum conditions.

SUMMARY OF THE INVENTION

The main object of the present invention is to provide a surface acoustic wave device which comprises a piezoelectric aluminum nitride thin film formed on a single crystal silicon substrate and which has a higher coupling coefficient than conventionally possible.

Accordingly, receiving a hint from the research which matured to the surface acoustic wave device of U.S. Pat. No. 4,868,444, we have conducted further research on surface acoustic wave devices comprising a single crystal silicon substrate and a piezoelectric aluminum nitride thin film formed thereon and having a thickness of several micrometers and found that the coupling coefficient of the device can be improved by setting the C-axis of the piezoelectric thin film at a suitable angle of inclination with respect to a normal to the substrate. The present invention has been accomplished based on this finding.

The surface acoustic wave device of the present invention comprises a single crystal silicon substrate and a piezoelectric thin film of single crystal or C-axis-oriented polycrystalline aluminum nitride formed on the surface of the substrate. The C-axis of the piezoelectric thin film is set in a direction in which the projection vector of the C-axis on a plane containing the axis of propagation direction of a surface acoustic wave and a normal axis of the single crystal silicon substrate makes a predetermined angle of inclination $\theta$ with respect to the axis of propagation direction.

The inclination angle $\theta$ of projection vector of the C-axis of the piezoelectric aluminum nitride thin film is set, for example, within the range of 0 degree $< \theta \leq 60$ degrees, and the piezoelectric thin film has a thickness h which satisfies the relationship, for example, of $20 \geq 2\pi h/\lambda \geq 1.8$ wherein $\lambda$ is the wavelength of the surface acoustic wave. Conventionally, the inclination angle $\theta$ was 0 degree or 90 degrees.

Consequently, the surface acoustic wave device embodying the present invention has a coupling coefficient up to a maximum of 2.22%, which is well above the conventional maximum value, i.e., 1.03%. The coupling coefficient was calculated by constructing a model of surface acoustic wave device which is generally recognized as being reliable as will be described later and strictly numerically analyzing the model with a computer. Manifestly, therefore, the theoretical value of coupling coefficient is highly accurate.

With the surface acoustic wave device disclosed in the above-mentioned U.S. Pat. No. 4,868,444, a higher coupling coefficient than in the prior art was realized by a piezoelectric aluminum nitride film having a relatively large thickness (at least several times the wavelength $\lambda$ of the surface acoustic wave) in the case where the propagation characteristics of the surface acoustic wave are determined only by the piezoelectric film, whereas with the present invention, a higher coupling coefficient than heretofore possible has been realized with a piezoelectric film which is thin (less than several times the wavelength $\lambda$ of the surface acoustic wave, e.g., up to 8 μm) in the case where the propagation characteristics of the surface acoustic wave are influenced not only by the piezoelectric film but also by the elasticity and piezoelectric characteristics of the substrate.

DETAILED DESCRIPTION OF EMBODIMENT

Figure 1:
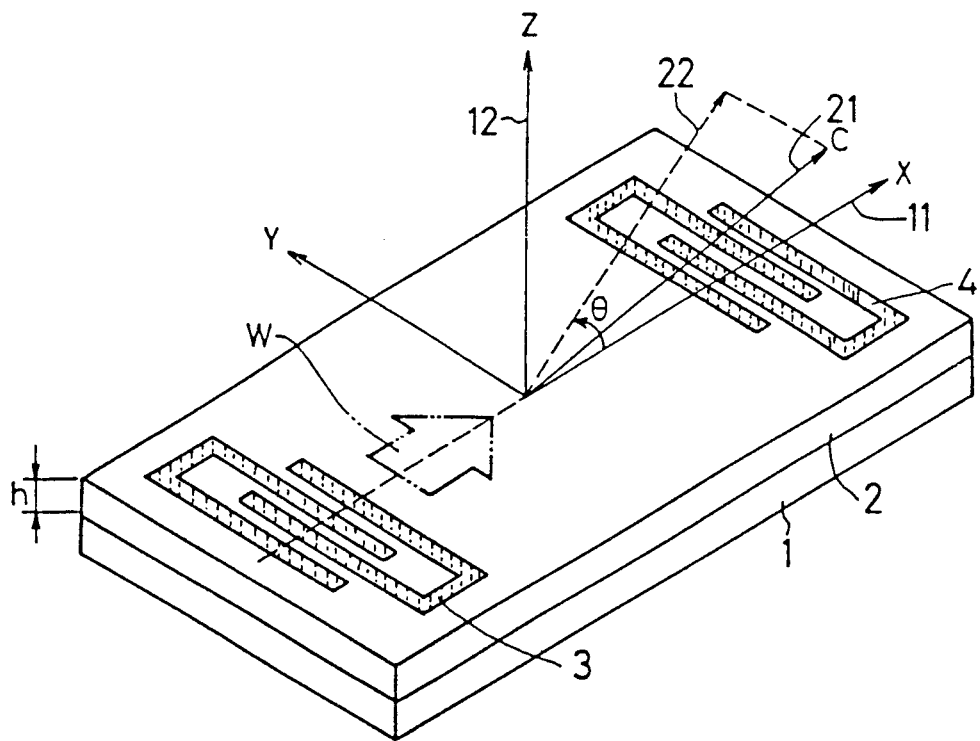
FIG. 1 is a perspective view showing the construction of a surface acoustic wave device embodying the present invention.

FIG. 1 shows a surface acoustic wave device which comprises a single crystal silicon substrate 1, and a piezoelectric thin film 2 of C-axis-oriented polycrystalline aluminum nitride having a thickness of about 1 μm to about 8 μm. A transmitting electrode 3 and a receiving electrode 4, each resembling a comb, are formed as opposed to each other on the surface of the piezoelectric thin film 2. A surface acoustic wave propagates from the transmitting electrode 3 toward the receiving electrode 4 in the direction of arrow W.

Alternatively, the transmitting electrode 3 and the receiving electrode 4 can be formed between the single crystal silicon substrate 1 and the piezoelectric aluminum nitride thin film 2.

FIG. 1 shows X-axis, Y-axis and Z-axis which are the crystal axes of the single crystal silicon substrate 1. The X-axis is in coincidence with the axis 11 of propagation direction of the surface acoustic wave. The Z-axis coincides with the axis 12 of a normal to the single crystal silicon substrate 1.

The C-axis 21 of the piezoelectric aluminum nitride thin film 2 is set in a direction in which the projection vector 22 of the C-axis on a plane containing the axis 11 of propagation direction of the surface acoustic wave and the normal axis 12 of the single crystal silicon substrate 1, i.e., on the X-Z plane, makes a predetermined angle of inclination $\theta$ with respect to the axis 11 of propagation direction.

The piezoelectric aluminum nitride thin film 2 can be formed by a known process such as sputtering or CVD (chemical vapor deposition).

Figure 2:
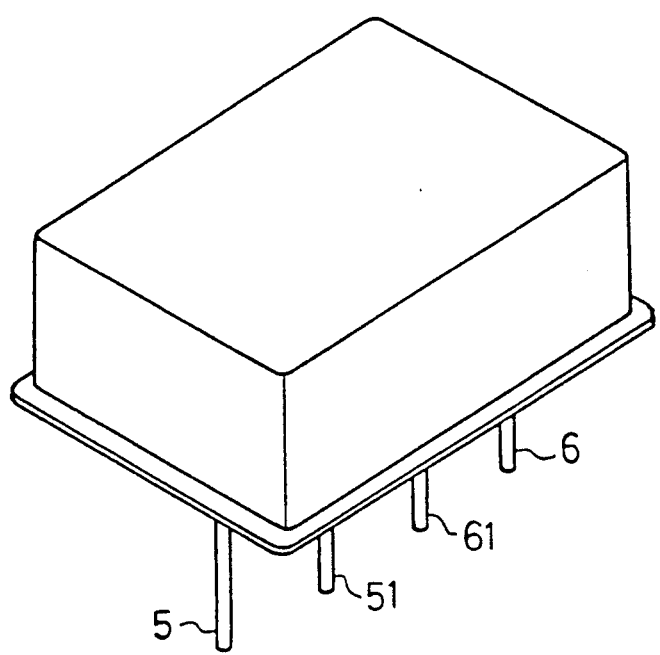
FIG. 2 is a perspective view showing the appearance of a package having the device of FIG. 1 enclosed therein.

FIG. 2 shows a package enclosing the device of FIG. 1 therein. The package has projecting therefrom input terminals 5, 51 connected to the transmitting electrode 3, and output terminals 6, 61 connected to the receiving electrode 4. When an electric signal is fed to the input terminals 5, 51 from an unillustrated external circuit, a surface acoustic wave in accordance with the input signal is emitted by the transmitting electrode 3 on excitation, received by the electrode 4 and delivered as an electric signal again from the output terminals 6, 61 to an external circuit.

In the course of accomplishing the present invention, we simulated variations in the coupling coefficient $K^2$ by altering the crystal surface of the single crystal silicon substrate 1 shown in FIG. 1, the angle $\theta$ between the projection vector 22 of the C-axis 21 and the propagation direction axis 11, the thickness h of the piezoelectric aluminum nitride thin film 2, the wavelength length $\lambda$ of surface acoustic waves and like conditions.

The coupling coefficient was calculated by applying the theories and calculation methods disclosed, for example, in "A Method for Estimating Optical Crystal Cuts and Propagation Direction for Excitation of Piezoelectric Surface Waves" (IEEE Transaction on Sonics and Ultrasonics, Vol. SU-15, No. 4, Oct. 1968, pp. 209-217), and "PHYSICAL ACOUSTICS-Principle and Methods-" (edited by WARRENT P. MASON and R. N. THURSTON, VOLUME IX 1972, ACADEMIC PRESS, NEW YORK and LONDON).

According to these calculation methods, a basic piezoelectric equation involving consideration of the anisotropy and piezoelectric characteristics of the surface acoustic wave propagating layer, Newton's equation of motion, Maxwell's electromagnetic equations, etc. are solved by numerical analysis to thereby calculate the surface wave propagation velocity Vm when the surface of the piezoelectric aluminum nitride thin film is electrically short-circuited, and the propagation velocity Vf on the free surface.

The coupling coefficient $K^2$ is calculated from the following equation using the propagation velocities Vm and Vf.

$$K^2 = 2(Vf - Vm)/Vf$$

Figure 3:
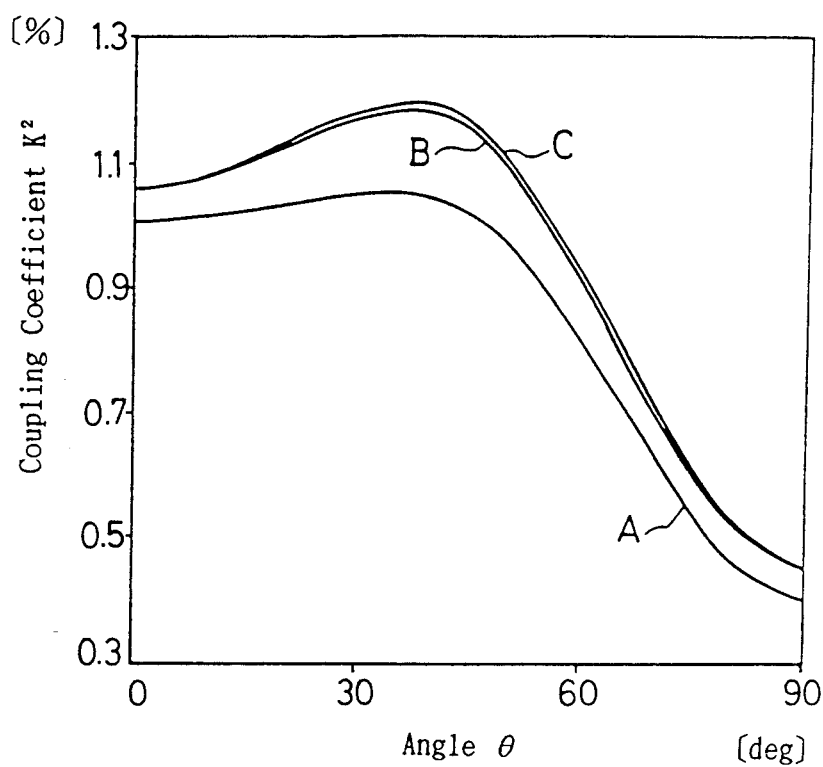
FIGS 3 to 5 are graphs showing the characteristics of the coupling coefficient $K^2$ relative to the angle of inclination $\theta$.
Figure 4:
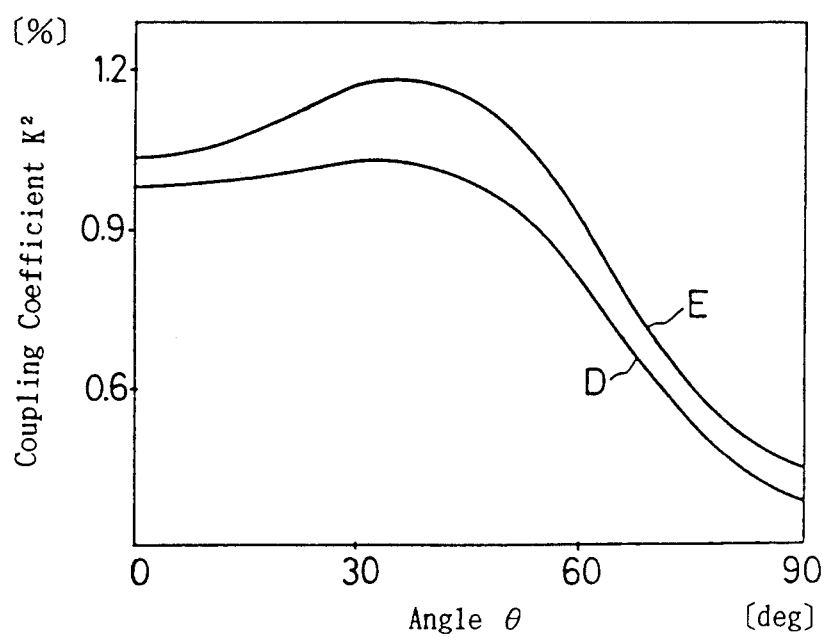
Figure 5:
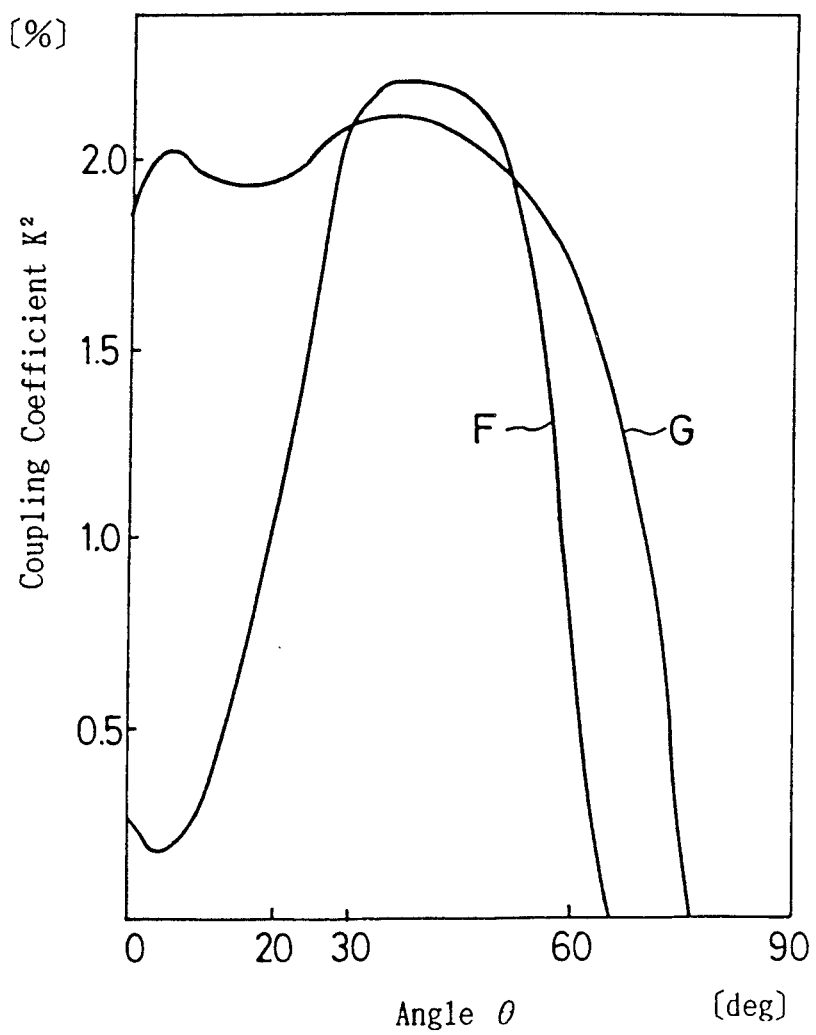

FIGS. 3 to 5 show some results of the above simulation, i.e., characteristics curves of coupling coefficients $K^2$ at varying inclination angles $\theta$ of 0 degree to 90 degrees.

The characteristics curves of FIG. 3 show the results obtained when the piezoelectric thin film forming surface of the single crystal silicon substrate 1 is the (001) crystal plane, the propagation direction axis 11 of surface acoustic waves is the [100] axis of the substrate 1, and the C-axis 21 of the piezoelectric aluminum nitride thin film 2 is present in the X-Z plane, with the C-axis 21 in coincidence with the projection vector 22. It is assumed that the thickness of the piezoelectric thin film 2 is h, and that the wavelength of surface acoustic waves is $\lambda$. Curve A represents the coupling coefficient characteristics in the case where $2\pi h/\lambda = 2.0$, curve B those when $2\pi h/\lambda = 2.5$, and curve C those when $2\pi h/\lambda = 2.6$.

These characteristics curves A, B and C reveal that the coupling coefficient $K^2$ increases as the inclination angle $\theta$ increases from 0 degree, then reaches a peak and thereafter decreases. At inclination angles $\theta$ of up to about 60 degrees, the coupling coefficient $K^2$ is greater than at an inclination angle $\theta$ of 0 degree which is the angle for the conventional surface acoustic wave device. With curve A, the coupling coefficient $K^2$ reaches a maximum of 1.05% at an inclination angle $\theta$ of 35 degrees. With curve B, the coupling coefficient $K^2$ reaches a maximum of 1.18% at an inclination angle $\theta$ of 37 degrees. With curve C, the coupling coefficient $K^2$ is a maximum of 1.20% at an inclination angle $\theta$ of 37 degrees and is greater at inclination angles $\theta$ of up to about 53 degrees than at 0 degree.

Further the smaller the value $2\pi h/\lambda$, the more gentle is the slope of the characteristics curve. When this value is less than about 1.8, the curve has no peak (not shown).

FIG. 4 shows characteristics curves obtained when the piezoelectric thin film forming surface of the single crystal silicon substrate 1 is the (110) crystal plane, the propagation direction axis 11 of surface acoustic waves is the [001] axis of the substrate 1, and the C-axis 21 of the piezoelectric aluminum nitride thin film 2 is present in the X-Z plane. Curve D represents the coupling coefficient characteristics when $2\pi h/\lambda = 1.8$, and curve E those when $2\pi h/\lambda = 2.6$.

These characteristics curves D and E also reveal the tendency for the coupling coefficient $K^2$ to increase as the inclination angle $\theta$ increases from 0 degree, then reach a peak and thereafter decrease. At inclination angles $\theta$ of up to about 60 degrees, the coupling coefficient $K^2$ is greater than at an inclination angle $\theta$ of 0 degree which is the angle for the conventional surface acoustic device. With curve D, the coupling coefficient $K^2$ reaches a maximum of 1.04% at an inclination angle of 33 degrees. With curve E, the coupling coefficient $K^2$ reaches a maximum of 1.18% at an inclination angle of 36 degrees and is greater at inclination angles of up to about 55 degrees that at 0 degree.

Further the smaller the value $2\pi h/\lambda$, the more gentle is the slope of the characteristics curve. When this value is less than about 1.8, the curve has no peak (not shown).

FIG. 5 shows characteristics curves obtained when the piezoelectric thin film forming surface of the single crystal silicon substrate 1 is the (111) crystal plane, the propagation direction axis 11 of surface acoustic waves is the [112] axis of the substrate 1, and the C-axis 21 of the piezoelectric aluminum nitride thin film 2 is present in the X-Z plane. Curve F represents the coupling coefficient characteristics when $2\pi h/\lambda=2.5$, and curve G those when $2\pi h/\lambda=2.6$.

These characteristics curves F and G reveal that the coupling coefficient $K^2$ is higher than about 1% at inclination angles $\theta$ in the range of about 20 degrees to about 60 degrees. With curve F, the coupling coefficient $K^2$ reaches a maximum of 2.22% at an inclination angle $\theta$ of 37 degrees. With curve G, the coupling coefficient $K^2$ reaches a maximum of 2.12% at an inclination angle $\theta$ of 36 degrees.

Figure 6:
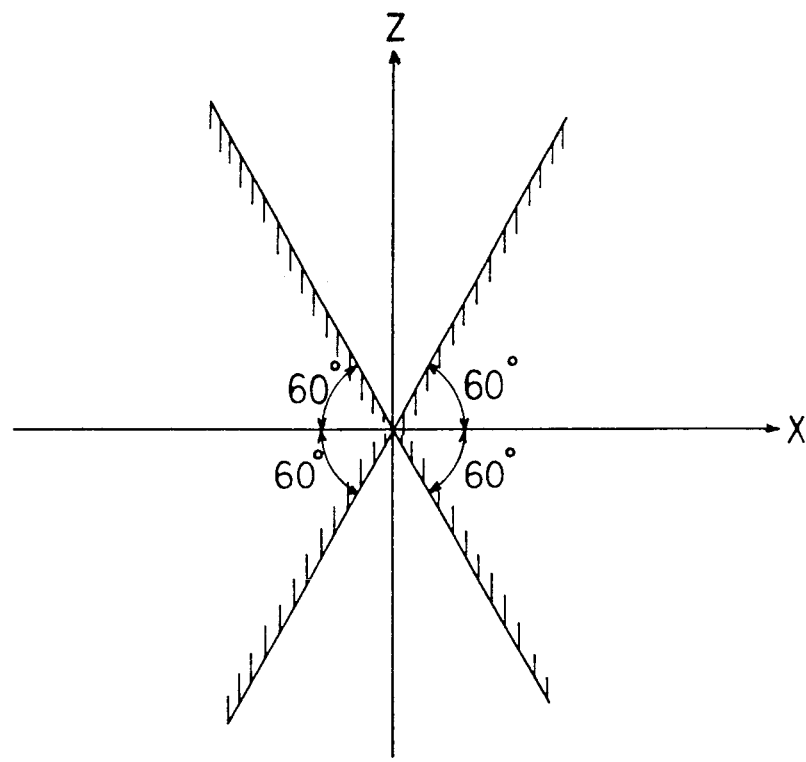
FIGS. 6 and 7 are diagrams showing the ranges of inclination angles giving high coupling coefficients.
Figure 7:
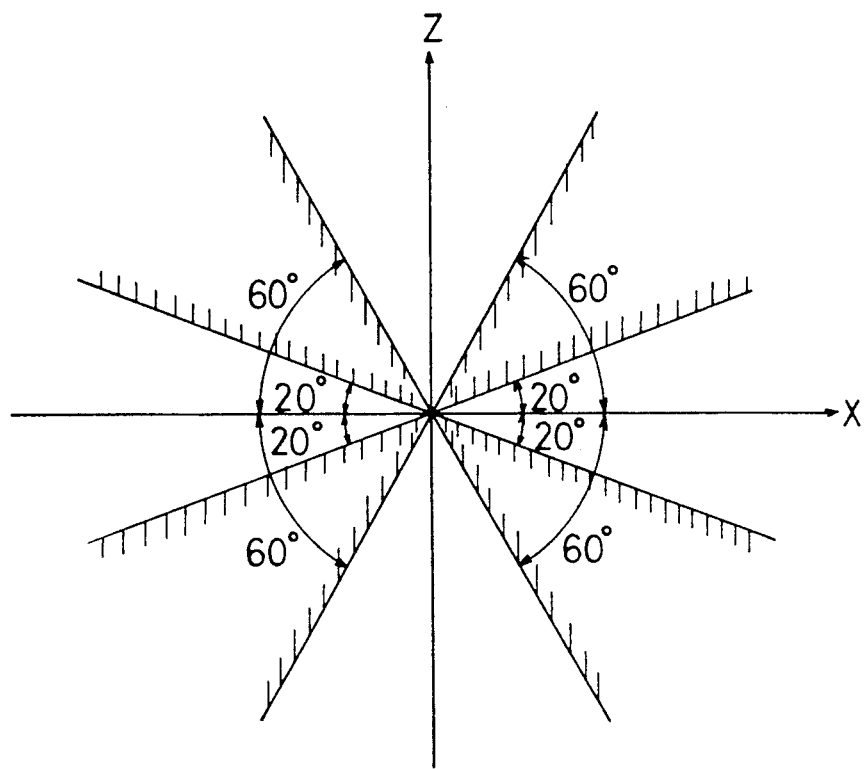

FIG. 6 shows the angular ranges of 0 degree $<\theta\leq 60$ degrees as hatched which are highly effective for giving high coupling coefficients in the case of FIGS. 3 and 4. FIG. 7 shows the angular ranges of 20 degrees $\leq\theta\leq 60$ degrees as hatched which are highly effective similarly in the case of FIG. 5. It is crystallographically apparent that such illustrated angular ranges which are symmetric with respect to the crystal axis produce an exactly identical effect.

FIGS. 3 to 5 show the results of simulation in the case where the single crystal silicon substrate 1 has the above-mentioned crystal plane and crystal axis in connection with the piezoelectric aluminum nitride thin film 2, whereas substantially the same result as above can be achieved in the case where the silicon substrate 1 has a plane equivalent to the above crystal plane or the crytal axis is slightly displaced.

Further FIGS. 3 to 5 show the results obtained in the case where the C-axis 21 of the piezoelectric aluminum nitride thin film 2 is positioned in the X-Z plane, whereas substantially the same result as above can be attained when the projection vector 22 is in the same direction even if the C-axis 21 is positioned outside the X-Z plane. This is apparent from the fact that the characteristics of C-axis-oriented polycrystalline aluminum nitride are determined only by the C-axis and that the A-axis is equivalent to the B-axis.

Further with respect to the thickness h of the piezoelectric aluminum nitride thin film 2, we have confirmed that substantially the same result as illustrated in FIGS. 3 to 5 can be achieved if the value of $2\pi h/\lambda$ is up to 20.

As described above, the surface acoustic wave device of the present invention can be given a higher coupling coefficient than heretofore possible by setting the angle of inclination of the C-axis within the angular range shown in FIG. 6 or 7 in the case where thickness h of the piezoelectric aluminum nitride thin film 2 is in the range of $20\geq 2\pi h/\lambda\geq 1.8$.

Incidentally according to the aforementioned Unexamined Japanese Patent Publication SHO 58-59617, the peak value of a curve corresponding to curve A in FIG. 4 of the invention and obtained under the same conditions is 0.98%, the corresponding peak value for curve B is 1.02%, and the corresponding peak value for curve C is 1.03%. These values are all smaller than the foregoing values obtained with the device of the present invention.

Further according to the aforementioned Unexamined Japanese Patent Publication SHO 58-59618, the peak value of a curve corresponding to curve D in FIG. 5 of the invention and obtained under the same conditions is 0.85%, and the corresponding peak value for curve E is 0.91%. These values are both smaller than the foregoing values obtained with the present device.

The foregoing description of the embodiment is given only for the purpose of illustrating the present invention and should not be construed as limiting the claimed invention or reducing the scope thereof. Furthermore the construction of the present device is not limited to that of the embodiment but can of course be modified variously by one skilled in the art without departing from the scope of the invention as defined in the appended claims.

For example, the piezoelectric thin film of C-axis-oriented polycrystalline aluminum nitride used in the above embodiment can be replaced by a piezoelectric thin film of single crystal aluminum nitride. Since the A-axis of single crystal aluminum nitride is equivalent to the B-axis thereof, the characteristics of the surface acoustic wave device can be determined by determining the orientation of C-axis in this case. Accordingly, the device can be of the same construction as when the piezoelectric thin film of C-axis-oriented polycrystalline aluminum nitride is used to produce the same effect as already described.

What is claimed is:

1. A surface acoustic wave device comprising a single crystal silicon substrate and piezoelectric thin film of single crystal or C-axis-oriented polycrystalline aluminum nitride formed on the surface of the substrate, the device being characterized in that the C-axis of the piezoelectric thin film is set in a direction in which the projection vector of the C-axis on a plane containing the axis of propagation direction of a surface acoustic wave and a normal axis of the single crystal silicon substrate makes a predetermined angle of inclination $\theta$ with respect to the axis of propagation direction, the inclination angle $\theta$ is in the range of 0 degree $<\theta\leq 60$ degrees, and the piezoelectric aluminum nitride thin film has a thickness h satisfying the relationship of $1.8\leq 2\pi h/\lambda\leq 20$ wherein $\lambda$ is the wavelength of the surface acoustic wave.

2. A surface acoustic wave device as defined in claim 1 wherein the piezoelectric thin film forming surface of the single crystal silicon substrate is the (001) crystal plane or a plane equivalent thereto.

3. A surface acoustic wave device as defined in claim 2 wherein the C-axis of the piezoelectric aluminum nitride thin film is set in the projection plane.

4. A surface acoustic wave device as defined in claim 3 wherein the axis of propagation direction is set to the [100] axis of the single crystal silicon substrate.

5. A surface acoustic wave device as defined in claim 1 wherein the piezoelectric thin film forming surface of the single crystal silicon substrate is the (110) crystal plane or a plane equivalent thereto.

6. A surface acoustic wave device as defined in claim 5 wherein the C-axis of the piezoelectric aluminum nitride thin film is set in the projection plane.

7. A surface acoustic wave device as defined in claim 6 wherein the axis of propagation direction is set to the [001] axis of the single crystal silicon substrate.

8. A surface acoustic wave device as defined in claim 1 wherein the piezoelectric thin film forming surface of the single crystal silicon substrate is the (111) crystal plane or a plane equivalent thereto.

9. A surface acoustic wave device as defined in claim 8 wherein the C-axis of the piezoelectric aluminum nitride thin film is set in the projection plane, and the inclination angle $\theta$ is in the range of 20 degrees $\leq \theta \leq 60$ degrees, the piezoelectric aluminum nitride thin film having a thickness h satisfying the relationship of $2.5 \leq 2\pi h/\lambda \leq 20$ wherein $\lambda$ is the wavelength of the surface acoustic wave.

10. A surface acoustic wave device as defined in claim 9 wherein the axis of propagation direction is set to the [112] axis of the single crystal silicon substrate.

* * * * *